United States Patent [19]
Rahman et al.

[11] Patent Number: 5,837,417
[45] Date of Patent: *Nov. 17, 1998

[54] QUINONE DIAZIDE COMPOSITIONS CONTAINING LOW METALS P-CRESOL OLIGOMERS AND PROCESS OF PRODUCING THE COMPOSITION

[75] Inventors: M. Dalil Rahman; Dinesh N. Khanna, both of Flemington; Daniel Aubin, Oxford, all of N.J.; Douglas McKenzie, Easton, Pa.

[73] Assignee: Clariant Finance (BVI) Limited, Virgin Islands (Br.)

[*] Notice: The terminal 11 months of this patent has been disclaimed.

[21] Appl. No.: 366,635

[22] Filed: Dec. 30, 1994

[51] Int. Cl.$^6$ ...................................................... G03F 7/023
[52] U.S. Cl. .......................... 430/169; 430/190; 430/191; 430/192; 430/193
[58] Field of Search ................................... 430/190, 191, 430/192, 193, 169

[56] References Cited

U.S. PATENT DOCUMENTS

| | | | |
|---|---|---|---|
| 2,929,808 | 3/1960 | Ross et al. | |
| 4,033,909 | 7/1977 | Papa. | |
| 4,033,910 | 7/1977 | Papa. | |
| 4,195,138 | 3/1980 | Ward | 525/404 |
| 4,250,031 | 2/1981 | Uejima et al. | 210/688 |
| 4,452,883 | 6/1984 | Frenchik et al. | 430/502 |
| 4,567,130 | 1/1986 | Held | 430/294 |
| 4,584,261 | 4/1986 | Held | 430/294 |
| 4,636,540 | 1/1987 | Warfel | 523/310 |
| 4,721,665 | 1/1988 | Dooley et al. | 430/169 |
| 4,747,954 | 5/1988 | Vaughn et al. | 210/670 |
| 4,784,937 | 11/1988 | Tanaka et al. | 430/331 |
| 4,833,067 | 5/1989 | Tanaka et al. | 430/331 |
| 4,914,006 | 4/1990 | Kato et al. | 430/331 |
| 5,073,622 | 12/1991 | Wojtech et al. | 528/486 |
| 5,116,715 | 5/1992 | Roland | 430/190 |
| 5,118,787 | 6/1992 | Furuno | 528/482 |
| 5,175,078 | 12/1992 | Aoyma et al. | 430/331 |
| 5,212,044 | 5/1993 | Liang et al. | 430/192 |
| 5,284,930 | 2/1994 | Matsumoto et al. | 528/482 |
| 5,286,606 | 2/1994 | Rahman et al. | 430/311 |
| 5,300,628 | 4/1994 | Honda | 528/482 |
| 5,350,714 | 9/1994 | Trefonas, III et al. | 437/229 |
| 5,378,802 | 1/1995 | Honda | 528/480 |
| 5,446,125 | 8/1995 | Honda et al. | 528/486 |
| 5,472,616 | 12/1995 | Szmanda et al. | 210/683 |
| 5,500,127 | 3/1996 | Carey et al. | 210/685 |
| 5,521,052 | 5/1996 | Rahman et al. | 430/270.1 |

FOREIGN PATENT DOCUMENTS

| | | |
|---|---|---|
| 544324 | 6/1993 | European Pat. Off. . |
| 544325 | 6/1993 | European Pat. Off. . |
| 0588492 | 3/1994 | European Pat. Off. . |
| 1072155 | 3/1989 | Japan . |
| 1-228560 | 9/1989 | Japan . |
| 4-65415 | 3/1992 | Japan . |
| 1509354 | 5/1978 | United Kingdom . |
| WO 90/01726 | 2/1990 | WIPO . |
| 93/12152 | 6/1993 | WIPO . |
| 93/18437 | 9/1993 | WIPO . |
| 94/01807 | 1/1994 | WIPO . |
| 94/12912 | 6/1994 | WIPO . |
| 94/14858 | 7/1994 | WIPO . |
| 94/14863 | 7/1994 | WIPO . |
| WO 96/12214 | 4/1996 | WIPO . |
| WO 20965 | 7/1996 | WIPO . |
| WO 96/21176 | 7/1996 | WIPO . |

OTHER PUBLICATIONS

Bayard; "Exchange Resin Use in its Preparation", No. 16, 1992, Water Free of Heavy Metals for Medical Use and Ion CA98(26).221589z.

Hirai et al; "and Metals with Chelating Ion Exchange Resins", Nov. 5, Treatment of Waste Waters Containing formaldehyde 1975; CA84(14):95328j.

Kimura et al; "Purification of Formaldehyde"; Mar. 9, 1977; CA87(7):52776y.

Journal of the Electrochemical Society, vol. 137, No. 12, Dec. 1990, Manchester, New Hampshire US, pp. 393900–3905, XP0001681, T. Tanada A New Photolithography Tech. w/Antireflective.

Chemical Abstracts, vol. 112, No. 18, Apr. 30, 1990, Columbus, OH, p. 17, the abstract 159201u, JP–A–1190713 (Inatomi, Shigeki et al) Jul. 31, 1989.

"Amberlite Ion Exchange Resins Laboratory Guide" by Rohm and HAAS Company, Philadelphia, PA, Sep. 1979.

G. Noti et al "Deionized Water Plants for Semiconductor Device Fabrication", Proceedings of the Inst:Radio & Electron.Eng, Aust. vol. 34, No. 2, Mar. 1973, pp. 45–51.

Derwent Publ. London, GB–JP–A–05 234 876, OCG Microelectronic Materials, Sep. 10, 1993.

*Primary Examiner*—Christopher G. Young
*Attorney, Agent, or Firm*—Andrew F. Sayko, Jr.

[57] ABSTRACT

Process for producing a photosensitizer comprising a diazo ester of a p-cresol oligomer where at least one of the hydroxy groups on the p-cresol ring has been esterified with diazo-sulfonyl chloride comprising from about 60 to 100 mole % 2,1,4 or 2,1,5-diazo sulfonyl chloride, or a mixture thereof; and a photoresist comprising an admixture of the photosensitizer, which is present in the photoresist composition in an amount sufficient to uniformly photosensitive the photoresist composition, a water insoluble, aqueous alkali soluble novolak resin, the novolak resin being present in the photoresist composition in an amount sufficient to form a substantially uniform photoresist composition, and a suitable solvent.

9 Claims, No Drawings

QUINONE DIAZIDE COMPOSITIONS CONTAINING LOW METALS P-CRESOL OLIGOMERS AND PROCESS OF PRODUCING THE COMPOSITION

FIELD OF THE INVENTION

The present invention relates to positive photoresist compositions especially sensitive in the broad band range of the spectrum (365–436 nm), based on a diazonaphthoquinone sensitizer using a metals free p-cresol oligomer as the backbone, a novolak resin and a solvent.

DESCRIPTION OF RELATED ART

Photoresists are materials which change their solubility in a developer solution after the photoresist has been exposed to actinic radiation, such as to ultra violet radiation. Photoresist compositions comprise a photosensitive compound (sometimes called a photosensitizer), a film forming polymeric resin and a solvent. There are other types of compositions possible, such as a photosensitizer composition dissolved in an appropriate solvent. The photoresist composition is applied to a substrate which is to be patterned and the solvent is then removed, as with heat, leaving the photoresist as a thin film covering the substrate. As a consequence of the exposure to radiation of the photoresist, a different solubility rate results between the exposed and unexposed (masked over) portions of the resist film which yields a surface relief pattern after development. Those photoresists which become more soluble in a developer solution in the exposed regions are referred to as "positive" photoresists. Those which become less soluble in the exposed regions are referred to as "negative" photoresists. The present invention deals with a class of those compounds suitable for use in positive photoresist compositions.

Positive photoresists may comprise a water soluble, aqueous alkali soluble resin, such as a novolak resin or a poly(p-hydroxystyrene), and a photosensitizer. The resin and sensitizer are applied, such as by spin coating, spray coating, or other suitable means, from an organic solvent or solvent mixture onto a substrate, such as a silicon wafer or a chrome-plated glass plate. The developers normally used to process the positive photoresists are aqueous alkaline solutions, such as sodium metasilicate, potassium hydroxide, tetramethyl ammonium hydroxide and ammonium hydroxide. The developer removes the areas of the coated photoresist film that have been exposed to light or other form of irradiation so as to produce a relief pattern in the photoresist film.

The application of a photosensitive film to various substrates is an essential step in the fabrication of integrated circuits. The substrates are generally silicon wafers which may have a thin oxide coating or other coating, such as silicon nitride or aluminum. The photosensitive film is used to pattern the substrate in a series of steps including exposure (through a mask pattern), development to yield a relief pattern in the resist layer and a substrate etch step to transfer that pattern into the substrate material. It is essential that the mask pattern be accurately reproduced in the substrate etch pattern. To achieve this high degree of accuracy, the mask pattern must be well resolved by the photoresist layer. Conventional photoresists may employ novolak resins as the water in soluble, alkali soluble, film forming polymer.

BACKGROUND OF THE INVENTION

The present invention relates to radiation sensitive positive working photoresist compositions and particularly to compositions containing novolak resins together with a photosensitizer which is a diazo sulfonyl ester substantially free of metals produced by reacting a 2,1,4- or 2,1,5- diazo sulfonyl chloride with a p-cresol oligomer as a backbone.

It is known to the skilled artisan to produce positive photoresist compositions, such as those described in U.S. Pat. Nos. 3,666,473; 4,115,128 and 4,173,470. These include water insoluble, aqueous alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak resin component of these photoresist formulations is soluble in aqueous alkaline solutions, but the sensitizer is not soluble prior to exposure. Upon imagewise exposure of portions of the coated substrate to actinic radiation, the sensitizer is rendered alkali soluble and the exposed areas of the coating become more soluble than the unexposed areas. This difference in solubility rates causes the exposed areas of the photoresist coating to be dissolved when the substrate is immersed in or otherwise contacted with an alkaline developing solution, while the unexposed areas are largely unaffected, thus producing a positive relief pattern on the substrate. The exposed and developed substrate is usually thereafter subjected to an etching process. The photoresist coating protects the coated areas of the substrate from the etchant and the etchant is only able to etch the uncoated areas of the substrate, which correspond to the areas that were exposed to actinic radiation. Thus, an etched pattern can be created on the substrate which corresponds to the pattern of the mask, stencil, template, etc., that was used to created selective exposure patterns on the coated substrate prior to development. The relief pattern of photoresist on a substrate produced by this method is useful for various applications including the manufacture of miniaturized integrated circuits.

The characteristics of the photoresist compositions, which are important in commercial practice, include its photospeed, contrast, resolution (edge acuity), thermal stability of the image during processing, processing latitude, line width control, clean development and unexposed film loss.

Photoresist contrast is the slope of the linear portion of the curve resulting from the plot of the log of exposure energy vs. normalized film thickness remaining under fixed development conditions. In use, development of an exposed resist coated substrate is continued until the coating on the exposed area is substantially completely dissolved away. Resolution refers to the capability of a resist system to reproduce the smallest equally spaced line pairs and intervening spaces of a mask which is utilized during exposure with a high degree of image edge acuity in the developed exposed spaces. In the manufacture of miniaturized electronic components, a photoresist is required to provide a high degree of resolution for very small line and space widths usually on the order of one micron or less. This capability to reproduce very small dimensions, is extremely important in the production of large scale integrated circuits on silicon chips and similar components. Circuit density on such a chip can only be increased, assuming photolithography techniques are utilized, by increasing the resolution capabilities of the resist. Although negative photoresists, wherein the exposed areas of resist coating become insoluble and the unexposed areas are dissolved away by the developer, have been extensively used for this purpose by the semiconductor industry, positive photoresists have inherently higher resolution and are utilized as replacements for the negative resists.

In photoresist technology, it has normally been desired to increase resist contrast. High contrast positive working resists produce developed images which exhibit high edge acuity, when exposure is performed on typical equipment such as steppers and projection aligners. In most lithographic semiconductor applications, the high edge acuity of developed images is of great importance, since it allows for small variations of line width over the wafer's topography. Therefore, it permits good control of etching during anisotropic plasma-etching and is typically associated with good processing latitude.

SUMMARY OF THE INVENTION

The invention provides a photosensitizer having a very low level of metal ions and new positive photoresist compositions containing this photosensitizer. Such photoresist compositions have good photospeed, high contrast, good resolution, good thermal stability of the image during processing, wide processing latitude, good line width control, clean development and low unexposed film loss.

The photosensitive compound of the present invention comprises: an admixture of (a) a photosensitizer comprising a diazo ester of p-cresol oligomers having a very low level of metal ions with diazo sulfonyl chloride comprising from about 60 to 100 mole percent of 2,1,4-or 2,1,5-sulfonyl chloride or a mixture thereof; the photosensitizer being present in the photoresist composition in an amount sufficient to uniformly photosensitive the photoresist composition; and (b) a water insoluble, aqueous alkali soluble novolak resin, the novolak resin being present in the photoresist composition in an amount sufficient to form a substantially uniform photoresist composition. Preferably the diazo ester distribution ranges from about 75 to 100 mole percent and most preferably from about 85 to 95 mole percent.

The invention also provides a method for producing a positive photoresist composition, which comprises providing an admixture of:

(a) a photosensitive component comprising a diazo sulfonyl ester of metals free p-cresol oligmers, having from about 60 mole percent to about 100 mole percent of the hydroxy groups of a p-cresol oligomer moiety esterified by one or more sulfonyl chlorides, the photosensitive component being present in the photoresist composition in an amount sufficient to uniformly photosensitize the photoresist composition; the diazo moiety ester comprises from about 60 to about 100 mole percent 2,1,4- or 2,1,5- diazo ester, or a mixture thereof Preferably, the diazo ester distribution ranges from about 75 to 100 mole percent and most preferably from about 85 to 95 mole percent;

(b) a p-cresol oligomers having a very low level of metal ions obtained by reacting p-cresol and formaldehyde in the presence of an acid catalyst, preferably oxalic acid or maleic anhydride, removing water and excess unreacted p-cresol, such as by distillation, e.g. atmospheric distillation (preferably carried out at a temperature from about 96° C. to 200° C.) or vacuum distillation (preferably carried out at a temperature from 200° C. to 220° C., under about 35 mm pressure), followed by adding a polar organic solvent, preferably acetone or methanol, preferably at a temperature of from 100° C. to 220° C., and filtering the solution: (The sensitizer is obtained by reacting the p-cresol oligomers solution in the polar organic solvent with a 2,1,4- and/or 2,1,5-diazonaphthoquinone);

(c) a water insoluble, aqueous alkali soluble novolak resin; the novolak resin being present in the photoresist composition in an amount sufficient to form a substantially uniform photoresist composition; and (d) a suitable photoresist solvent, preferably propylene glycol methyl ether acetate (PGMEA), 2-heptanone, ethyl lactate, ethyl 3-ethoxy propionate (EEP) or a mixture of any of the above. Such a p-cresol oligomer having a very low level of metal ions can not be obtained unless the oligomers are dissolved in the polar organic solvent and filtered through a 0.01 to 0.10 µm filter, preferably 0.01 to 0.05 µm.

The invention further provides a process for producing a photosensitive element by producing a photoresist image on a substrate, which comprises coating a substrate with a positive working photoresist composition produced by providing an admixture of (a) a photosensitive component comprising a diazo sulfonyl ester of metals free p-cresol oligmers, having from about 60 mole percent to about 100 mole percent of the hydroxy groups of a p-cresol oligomer moiety esterified by one or more sulfonyl chlorides, the photosensitive component being present in the photoresist composition in an amount sufficient to uniformly photosensitize the photoresist composition; the diazo moiety ester comprises from about 60 to about 100 mole percent 2,1,4- or 2,1,5- diazo ester, or a mixture thereof Preferably, the diazo ester distribution ranges from about 75 to 100 mole percent and most preferably from about 85 to 95 mole percent;

(b) p-cresol oligomers having very low level of metal ions obtained by reacting p-cresol and formaldehyde in the presence of an acid catalyst, preferably oxalic acid or maleic anhydride, removing water and excess unreacted p-cresol, such as by distillation, e.g. atmospheric distillation (preferably carried out at a temperature from about 96° C. to 200° C.) or vacuum distillation (preferably carried out at a temperature from 200° C. to 200° C., under about 35 mm pressure), followed by adding a polar organic solvent, preferably acetone or methanol, preferably at a temperature of from 100° C. to 220° C., and filtering the solution: (The reacting p-cresol oligomers solution in the polar organic solvent with a 2,1,4- and/or 2,1,5-diazonaphthoquinone);

(c) a water insoluble, aqueous alkali soluble novolak resin; the novolak resin being present in the photoresist composition in an amount sufficient to form a substantially uniform photoresist composition; and (d) a suitable photoresist solvent, preferably propylene glycol methyl ether acetate (PGMEA), 2-heptanone, ethyl lactate, ethyl 3-ethoxy propionate (EEP) or a mixture of any of the above;

(e) coating a suitable substrate with the photoresist composition;

(f) heat treating the coated substrate until substantially all of the solvent is removed;

(g) image-wise exposing the photoresist composition; and (h) removing the image-wise exposed areas of the photoresist composition with a suitable developer.

DETAILED DESCRIPTION OF THE PREFERRED EMBODIMENT

In the production of the relief image of the present invention, one coats and dries the foregoing photoresist composition on a suitable substrate.

Novolak resins have been commonly used in the art of photoresist manufacture as exemplified by "Chemistry and Application of Phenolic Resins", Knop A. and Scheib, W.; Springer Verlag, New York, 1979 in Chapter 4. Similarly, o-quinone diazides are well known to the skilled artisan as demonstrated by "Light Sensitive System", Kosar, J.; John Wiley & Sons, New York, 1965 in Chapter 7.4.

The particular photosensitizer which is a component of the photoresist composition of the present invention is a diazo ester of p-cresol oligomers, having an the average from about 60 mole percent to 100 mole percent of its hydroxy groups esterified by diazo sulfonyl chloride, which is 2,1,4-diazo sulfonyl chloride or 2,1,5-sulfonyl chloride, or a mixture thereof The photoresist composition is formed by blending the ingredients in a suitable solvent composition. In the preferred embodiment, the amount of novolak resin in the photoresist ranges from 65% to about 99%, most preferably from about 70% to about 95%, based on the weight of the solid, i.e. non-solvent, photoresist components. In the preferred embodiment, the sensitizer is present in the photoresist in an amount of from about 1% to about 35%, most preferably from about 5% to about 30%, based on the weight of the solid photoresist components. In manufacturing the photoresist composition, the novolak resin and photosensitizer are dissolved in photoresist solvents such as acetone, chlorobenzene, propylene glycol mono-alkyl ether, propylene glycol alkyl ether acetates, ethyl lactate, butyl acetate, xylene, ethylene glycol monoethyl ether acetate, and most preferably propylene glycol mono-methyl ether acetate (PGMEA), 2-heptanone, ethyl lactate, and ethyl-3-ethoxypropionate (EEP) among others.

Other optional ingredients such as colorants, dyes, antistriation agents, leveling agents, plasticizers, adhesion promoters, speed enhancers, solvents and such surfactants as nonionic surfactants may be added to the solution of novolak resin, sensitizer and solvent before the solution is coated onto a substrate. Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five weight percent level, based on the combined weight of novolak and sensitizer. Plasticizers which may be used include, for example, phosphoric acid tri-(beta-chloroethyl) -ester; stearic acid; dicamphor; polypropylene; acetal resins; phenoxy resins; and alkyl resins at one to ten percent weight levels, based on the combined weight of novolak and sensitizer. The plasticizer additives improve the coating properties of the material and enable the application of a film that is smooth and of uniform thickness to the substrate. Adhesion promoters which may be used include, for example, beta-(3,4-epoxy-cyclohexyl)-ethyltrimethoxysilane; p-methyl-disilane-methylmethacrylate; vinyltrichlo-rosilane; and gamma-amino-propyl triethoxysilane up to about a 4 weight percent level, based on the combined weight of novolak and sensitizer. Development speed enhancers that may be used include, for example, picric acid, nicotinic acid or nitrocinnamic acid by a weight level of up to 20 percent, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

The coating solvents may be present in the overall composition in an amount of up to about 95% by weight of the solids in the composition. Solvents, of course, are substantially removed after coating of the photoresist solution on a substrate and drying. Non-ionic surfactants that may be used include, for example, nonylphenoxy poly(ethyleneoxy) ethanol; octylphenoxy ethanol at up to about a 10 weight percent level, based on the combined weight of novolak and sensitizer.

The prepared resist solution, can be applied to a substrate by any conventional method used in the photoresist art, including dipping, spraying, whirling and spin coating. When spin coating, for example, the resist solution can be adjusted with respect to the percentage of solids content in order to provide coating of the desired thickness given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters. The substrate may have an adhesion promoted layer of a suitable composition such as one containing hexa-alkyl disilazane.

The resist composition solution is then coated onto the substrate, and the substrate is temperature treated at from about 80° C. to about 110° C. for from about 30 seconds to about 180 seconds on a hot plate or for from about 15 to about 40 minutes in a convection oven. This temperature treatment is selected in order to reduce the concentration of residual solvents in the photoresist while not causing substantial thermal degradation of the photosensitizer. In general one desires to minimize the concentration of solvents and thus this first temperature treatment is conducted until substantially all of the solvents have evaporated and a thin coating of photoresist composition, on the order of a micron in thickness, remains on the substrate. In a preferred embodiment the temperature is conducted at from about 85° C. to about 95° C. The treatment is conducted until the rate of change of solvent removal becomes relatively insignificant. The temperature and time selection depends on the resist properties desired by the user as well as equipment used and commercially desired coating times. The coating substrate can then be exposed to actinic radiation, especially ultraviolet radiation, at a wavelength of from about 300 nanometers ("nm") to about 450 nm (preferably at about 365 nm), x-ray, electron beam, ion beam or laser radiation, in any desired pattern, produced by use of suitable masks, negatives, stencils, templates, etc.

The photoresist is then optionally subjected to a post exposure second baking or heat treatment, either before or after development. The heating temperatures may range from about 90° C. to about 150° C., more preferably from about 110° C. to about 150° C. The heating may be conducted for from about 10 seconds to about 3 minutes, more preferably from about 45 seconds to about 90 seconds on a hot plate or about 10 to about 30 minutes by convection oven.

The exposed resist-coated substrates are developed to remove the imagewise exposed, non-image areas by spray developing using an alkaline developing solution. The solution is preferably agitated, for example, by nitrogen burst agitation. The substrates are allowed to remain in the developer until all, or substantially all, of the resist coating has dissolved from the exposed areas. Developers may include aqueous solutions of ammonium or alkali metal hydroxides. One preferred hydroxide is tetramethyl ammonium hydroxide (TMAH). A suitable developer is AZ® Developer available commercially from the AZ Photoresist Products group of Hoechst Celanese Corporation, Somerville, N.J. After removal of the coated wafers from the developing solution, one may conduct an optional post-development heat treatment or bake in increase the coating's adhesion and chemical resistance to etching solutions and other substances. The post-development heat treatment can comprise the oven baking of the coating and substrate below the coating's softening point. The industrial applications, particularly in the manufacture of microcircuitry units on silicon/silicon dioxide-type substrates, the developed substrates may be treated with a buffered, hydrofluoric acid base etching solution. The resist compositions of the present invention are resistant to acid-base etching solutions and provide effective protection for the unexposed resist-coating areas of the substrate.

The following specific examples will provide detailed illustrations of the methods of producing and utilizing the compositions of the present invention. These examples are not intended to limit or restrict the scope of the invention in any way and should not be construed as providing conditions, parameters or values which must be utilized exclusively in order to practice the present invention.

EXAMPLE 1

Synthesis of p-Cresol Oligomers Having Very Low Level of Metal Ions p-Cresol (103.23 g) was condensed in a 3-neck flask with formaldehyde(55.21 g) in the presence of oxalic acid (1.5 g) in water (5 ml) at 96° C. for 6 hours. The reaction mixture was distilled initially under atmospheric pressure and then under vacuum (temperature 220° C., pressure 20 mm). The molten resin was allowed to cool to 120° C. and acetone (925 g) was added to make a 25% solids solution, which was filtered through a 0.1 $\mu$m filter. Relative Molecular Weight (RMW) of this oligomer was 6.0; the amount of Na, Fe and K present was <20 ppb.

EXAMPLE 2 p-Cresol (116.15 lbs) was charged to a stainless steel reactor, oxalic acid (7.5 lbs) and 25 lbs of water were added with agitation. Formaldehyde (276.05 lbs, 37%) was added over a period of 2 hours at 96° C. After formaldehyde addition, the reaction was allowed to proceed for 6 hours. The reaction mixture was then distilled initially under atmospheric pressure and then under vacuum. The molten oligomer was allowed to cool to 120° C. and acetone (4625 lbs) was added at 120° C. and the solution was filtered through a 0.2 mm filter. The metals data are shown in Table 1 below.

EXAMPLES 3 & 4

Example 2 was repeated twice. The metals data of examples 3 and 4 are shown in Table 1 below.

TABLE 1

| Metals in p-Cresol Oligomers Acetone Solution (ppb) | | | |
|---|---|---|---|
| Metals | Example 2 | Example 3 | Example 4 |
| Na* | 205 | 650 | 211 |
| K | <5 | 5 | <5 |
| Fe | 6 | 17 | 10 |
| Cr | 6 | 7 | <5 |
| Cu | <5 | 11 | <5 |
| Mg | <5 | <5 | <5 |
| Al | 7 | 10 | 6 |
| Mn | <5 | <5 | <5 |

COMPARATIVE EXAMPLE

Example 2 was repeated except that instead of using acetone as the solvent, p-cresol oligomer was isolated as a solid. The oligomer that was obtained contained very high level of metal ions as shown in Table 2 below.

TABLE 2

| Metals in p-Cresol Oligomers | |
|---|---|
| Metals | Comparative Example |
| Na | 600 |
| K | 207 |
| Fe | >1200 |
| Cr | 780 |
| Cu | 80 |
| Mg | 141 |
| Zn | 123 |
| Ca | 474 |
| Al | 320 |
| Mn | 416 |

Example 2 was repeated and the solid p-cresol oligomer was dissolved in propylene glycol methyl ether acetate and filtered through a 0.1 $\mu$m filter to remove metals. It was found that the level of metal ions were still high.

EXAMPLE 5

Synthesis of 2,1,4-Diazo Ester of p-Cresol Oligomers

Into a 500 ml., four necked flask equipped with a thermometer, stirring shaft and dropping funnel were added 74 grams of an acetone solution (0.1667 moles) of p-cresol oligomers from example 2 and 15.01 grams (0.0558 moles) of 2,1,5-diazo sulfonyl chloride and 10 ml. of acetone. The mixture was stirred at room temperature (25° C.) for about 30 minutes to obtain a clear solution.

Triethylamine(5.89 g) was added into the reaction flask by a dropping funnel over a period of 20 to 30 minutes, while maintaining the temperature at 30° C. The reaction mixture was stirred for 1.5 hours at room temperature. After the reaction was complete, 0.91 g. of glacial acetic acid was added to destroy any unreacted sulfonyl chloride. The reaction mixture was then stirred for one hour and cooled to 10° C. and then filtered to remove salt and any impurities.

The reaction mixture was precipitated by drowning into a mixture of 672 gm of deionized water and 448 gm. of methanol. A yellow fine precipitate was obtained, which was stirred for several hours, then decanted, filtered and washed with about 5 liters of deionized water. The yellow cake was air dried at room temperature by drawing air through a buchner funnel. After the cake was air dried, it was left overnight in a vacuum oven at 35° C. The yield of the product was 22 grams (95%).

EXAMPLE 6

Synthesis of 2,1,5-Diazo Ester of p-Cresol Oligomers

Into a 500 ml., four necked flask equipped with a thermometer, stirring shaft and dropping funnel were added 74.10 grams of an acetone solution (0.1667 moles) of p-cresol oligomers from example 2 and 15.01 grams ( moles) of 2,1,5-diazo sulfonyl chloride and 10 ml. of acetone. The mixture was stirred at room temperature (25° C.) for about 30 minutes to obtain a clear solution.

Triethylamine(5.89 g) was added into the reaction flask by a dropping funnel over a period of 20 to 30 minutes, while maintaining the temperature at 30° C. The reaction mixture was stirred for 1.5 hours at room temperature. After the reaction was complete, 0.91 g. of glacial acetic acid was added to destroy any unreacted sulfonyl chloride. The reaction mixture was then stirred for one hour, cooled to 10° C. and then filtered to remove salt and any impurities.

The reaction mixture was precipitated by drowning into a mixture of 672 g of deionized water and 448 g. of methanol. A yellow fine precipitate was obtained, which was stirred for several hours, then decanted, filtered and washed with about 5 liters of deionized water. The yellow cake was air dried at room temperature by drawing air through a buchner funnel. After the cake was air dried, it was left overnight in a vacuum oven at 35° C.

The yield of the product was 22.1 grams (95%).

EXAMPLE 7

A 100 gram photoresist sample was prepared according to the following formulation:
EPA-stock-S (a m/p-cresols/formaldehyde novolak resin which was the condensation product of 1.0 part of a 70/30 mixture of M- and P-cresol, and 0.73 part of formaldehyde, and had a G.P.C. Molecular Weight of about 8000) available from AZ Photoresist Products=9.67 g.
EPA-stock-F (a m/p-cresols/formaldehyde fractionated novolak resin which was the condensation product of 1.0 part of a 70/30 mixture of M- and P-cresol, and 0.73 part of formaldehyde, and has a GPC Molecular Weight of about 4000) available from AZ Photoresist Products=34.50 g.
2,1,4 ester of p-cresol oligomer from example #5=3.68 g.
FC-430 (Fluoroaliphatic polymeric esters—98.5%, Toluene—1.5%, available from 3M) Surfactant=0.05 g.
EPA solvent mixture (85.5% PGMEA, 8.0% N-butyl acetate, 6.5% xylene)=51.98 g.

An aliquot of the above composition was applied to silicon wafer by spin-coating and the coated wafer was baked at 100° C. for 60 seconds. The coated film thickness was 0.65 microns. The exposure matrix was printed on the coated wafers using a Nikon NSR 1755i7B I line stepper. The post exposure bake was 100° C. for 60 seconds. The exposed film was developed using an aqueous alkaline developer (MF 81 A (47% solution of a 90/10 mixture of TMAH and 3-aminopropanol) for 200 seconds at 19° C. The $E_{CD}$ (mj/cm$^2$) was 96 and the unexposed film loss was 1.95 percent.

What is claimed is:

1. A method for producing a positive photoresist composition comprising:

(a) p-cresol oligmers, having a sodium ion level ≦650 ppb, an iron ion level of <20 ppb and a potassium ion level of <20 ppb, by reacting p-cresol and a formaldehyde solution in water in the presence of an acid catalyst, removing water and excess unreacted p-cresol, adding a polar organic solvent to the oligomers and filtering the solution through a filer having a pore size from 0.01 μm to 0.10 μm;

(b) preparing a photosensitive component by the esterification of from about 60 mol % to about 100 mol % of the hydroxy groups of the p-cresol oligomers of (a) by one or more diazo sulfonyl chlorides, the diazo ester moieties comprising from about 60 to about 100 mol % of 2,1,4- diazo ester and/or 2,1,5-diazo ester;

(c) providing an admixture of:
        (1) said photosensitive component of (b) in an amount sufficient to uniformly photosensitize the photoresist composition,
        (2) a water insoluble, aqueous alkali soluble novolak resin, this resin being present in the photoresist composition in an amount sufficient to form a substantially uniform photoresist composition, and
        (3) a suitable photoresist solvent.

2. The process of claim 1 wherein in (a) said formaldehyde is a 30 to 40 percent solution in water.

3. The process of claim 1 wherein in (a) said acid catalyst is oxalic acid.

4. The process of claim 1 wherein said organic polar solvent is acetone or methanol.

5. The process of claim 1 wherein the water and excess unreacted p-cresol in (a) is removed by atmospheric or vacuum distillation.

6. The process of claim 5 wherein atmospheric distillation is carried out at a temperature from about 96° C. to 200° C.

7. The process of claim 5 wherein vacuum distillation is carried out at a temperature from 200° C. to 220° C., under about 35 mm pressure.

8. The process of claim 1 wherein in (a) the organic polar solvent is added to the molten p-cresol oligomer at a temperature of from about 100° C. to 220° C.

9. The process of claim 1 wherein in (a) the p-cresol oligomer is filtered through 0.01 to 0.05 μm filter.

* * * * *